US012230955B2

United States Patent
Marques et al.

(10) Patent No.: US 12,230,955 B2
(45) Date of Patent: Feb. 18, 2025

(54) INDUSTRIAL SYSTEMS WITH INTEGRATED ABSENCE OF VOLTAGE TESTER (AVT) AND POSITIVE LOAD INDICATION (PLI) APPARATUS

(71) Applicant: Rockwell Automation Technologies, Inc., Mayfield Heights, OH (US)

(72) Inventors: Roberto Sampaio Marques, Mequon, WI (US); Philip M. Hamilton, Bettendorf, IA (US); Troy Micheal Bellows, East Helena, MT (US); Todd Richard Sauve, Oak Creek, WI (US); Kurt R. Mickler, Waukesha, WI (US); Robert Stafford Dilgard, Shorewood, WI (US)

(73) Assignee: Rockwell Automation Technologies, Inc., Mayfield Heights, OH (US)

( * ) Notice: Subject to any disclaimer, the term of this patent is extended or adjusted under 35 U.S.C. 154(b) by 183 days.

(21) Appl. No.: 17/948,705

(22) Filed: Sep. 20, 2022

(65) Prior Publication Data

US 2024/0097432 A1 Mar. 21, 2024

(51) Int. Cl.
*H02H 7/20* (2006.01)
*G01R 19/155* (2006.01)
*H02H 1/00* (2006.01)

(52) U.S. Cl.
CPC ............ *H02H 7/20* (2013.01); *G01R 19/155* (2013.01); *H02H 1/0007* (2013.01)

(58) Field of Classification Search
CPC ........ H02H 7/20; H02H 7/0007; H02H 3/044; G01R 19/155; G01R 15/14; G01R 15/144; G01R 31/66; H02J 3/0012

USPC ...................................... 361/86, 87
See application file for complete search history.

(56) References Cited

U.S. PATENT DOCUMENTS

| | | | |
|---|---|---|---|
| 2016/0187393 A1* | 6/2016 | Ramirez | G01R 19/155 324/126 |
| 2018/0315573 A1 | 11/2018 | Curtis et al. | |
| 2019/0391186 A1* | 12/2019 | Bollman | G01R 15/144 |
| 2021/0216061 A1 | 7/2021 | Mazur et al. | |

(Continued)

FOREIGN PATENT DOCUMENTS

CA 3152091 A1 9/2022

OTHER PUBLICATIONS

Siemens, "Centerline® 2100 SecureConnect", Allen-Bradley, Rockwell Software, Rockwell Automation, Publication 2100-PP022D-EN-P—Jun. 2017, Rockwellautomation.com, 4 pages.

(Continued)

*Primary Examiner* — Danny Nguyen

(57) ABSTRACT

An industrial system includes a load control assembly, an integrated absence of voltage tester (AVT), and an absence of voltage indicator. The load control assembly has a supply input, a load output, a disconnecting device, and a load controller coupled to the load output, with the disconnecting device coupled between the supply input and the load controller. The AVT is integrated into one of the disconnecting device and the load controller, and the AVT configured to detect an absence of an operating voltage of the load control assembly. The absence of voltage indicator is coupled to the AVT and configured to indicate the absence of an operating voltage of the load control assembly detected by the AVT.

20 Claims, 5 Drawing Sheets

(56) References Cited

U.S. PATENT DOCUMENTS

| | | |
|---|---|---|
| 2021/0390809 A1 | 12/2021 | Marques et al. |
| 2022/0085580 A1* | 3/2022 | Kuzniak ............... H01H 9/22 |
| 2022/0244711 A1 | 8/2022 | Bulanda et al. |
| 2022/0247165 A1 | 8/2022 | Campbell et al. |
| 2022/0276287 A1* | 9/2022 | Bugaris ............... G01R 19/155 |

OTHER PUBLICATIONS

Extended European Search Report from EP patent application 23197958.4 dated Jun. 4, 2024, 13 pages.

* cited by examiner

INDUSTRIAL SYSTEMS WITH INTEGRATED ABSENCE OF VOLTAGE TESTER (AVT) AND POSITIVE LOAD INDICATION (PLI) APPARATUS

BACKGROUND INFORMATION

Maintenance technicians must be sure that there is no energy applied to a load control unit prior to opening the door of the unit for maintenance operations. A permanent independent electrical safety device can be installed in every unit to perform this function, but this approach adds significant cost and occupies valuable space.

BRIEF DESCRIPTION

In one aspect, an industrial system includes a load control assembly, an absence of voltage tester (AVT), and an absence of voltage indicator. The load control assembly has a supply input, a load output, a disconnecting device, and a load controller coupled to the load output. The disconnecting device is coupled between the supply input and the load controller. The AVT is integrated into one of the disconnecting device and the load controller and the AVT is configured to detect an absence of an operating voltage of the load control assembly. The absence of voltage indicator is coupled to the AVT and is configured to indicate the absence of an operating voltage of the load control assembly detected by the AVT.

In another aspect, an industrial system includes a load control assembly, a positive load identification (PLI) component, and a PLII indicator. The load control assembly has a supply input, a load output, a disconnecting device, and a load controller coupled to the load output. The disconnecting device is coupled between the supply input and the load controller. The PLI component is integrated into the load controller and configured send a load indication signal to the load output. The PLII indicator is integrated into a load and coupled to the load output to receive the load indication signal, and the PLII indicator is configured to indicate connection of the load in response to the load indication signal.

DETAILED DESCRIPTION

Figure 1:
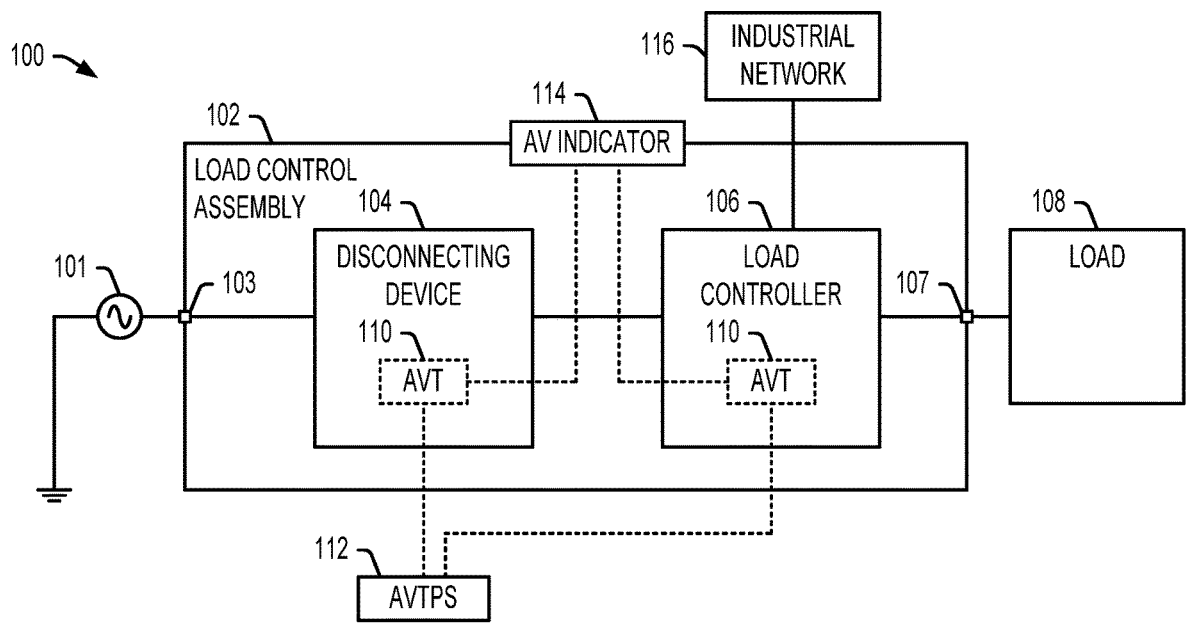
FIG. 1 is a system diagram of an industrial system having a load control assembly with an integrated absence of voltage tester.

Referring now to the figures, several embodiments or implementations are hereinafter described in conjunction with the drawings, wherein like reference numerals are used to refer to like elements throughout, and wherein the various features are not necessarily drawn to scale. Also, the term "couple" or "couples" includes indirect or direct electrical or mechanical connection or combinations thereof. For example, if a first device couples to or is coupled with a second device, that connection may be through a direct electrical connection, or through an indirect electrical connection via one or more intervening devices and connections. One or more operational characteristics of various circuits, systems and/or components are hereinafter described in the context of functions which in some cases result from configuration and/or interconnection of various structures when circuitry is powered and operating. Unless otherwise stated, "about," "approximately," or "substantially" preceding a value means +/−10 percent of the stated value.

FIG. 1 shows an industrial system 100 having a main power source 101 and a load control assembly 102 with an integrated absence of voltage tester. In one example, the load control assembly is, includes, or is part of, a load control unit. The load control assembly 102 has a supply input 103 configured to be connected to the power source 101 in order to receive input power. In one implementation, the input power is a single or multiphase AC signal provided by a single or multiphase AC power source 101. In another example, the input power is a DC signal provided by a DC power source 101. The load control assembly 102 has a disconnecting device 104 coupled between the supply input 103 and a load controller 106. The connection of the disconnecting device 104 provides an interruptible power path between the supply input 103 and a power input of the load controller 106. The power path in one example is a single or multiphase AC power path with two or more power lines. In another example, the power path is a DC power path with one or two power lines. The load control assembly 102 also includes a load output 107 coupled to a power output of the load controller 106. The load output 107 is configured to be connected to an output load 108.

The load controller 106 in one example includes power conversion circuitry (not shown), for example, to convert input AC power to provide DC power to an intermediate DC bus or DC link circuit (not shown), as well as an output inverter (not shown), for example, to convert DC power from the DC bus to provide single or multiphase output AC power to drive an AC load 108. The load 108 in this example can be any type or form of single or multiphase AC load, such as a single or multiphase motor, a heating system, a lighting system, etc. In another example, the load controller 106 includes a DC to DC converter (not shown), for example, to convert DC input power to drive a DC load 108. In another example, the load controller 106 includes an output inverter (not shown), for example, to convert DC input power from the disconnecting device 104 to drive an AC load 108, such as, a single or multiphase motor, lighting system, heating system, etc.

The load control assembly 102 also includes an absence of voltage tester (e.g., labeled AVT in the drawings) 110 that is integrated into one or both of the disconnecting device 104 and/or the load controller 106. The AVT 110 is described hereinafter in singular form, and the following description applies to both AVTs 110 if multiple AVTs 110 are provided in the load control assembly 102. The AVT 110 is configured to detect an absence of an operating voltage of the load control assembly 102. In one example, the AVT 110 is configured to test and indicate that the load controller 106 has absence of DC/AC Voltage. In the case of a variable frequency drive (VFD) type load controller, the AVT 110 in one example is configured to indicate that there is no voltage in a DC bus of the drive.

The industrial system 100 also includes an absence of voltage power source 112 (e.g., labeled AVTPS in the drawings). The AVTPS 112 is coupled to the AVT 110. The AVTPS 112 supplies power to the AVT 110 independent of the powered or unpowered status of the power path and the operational state of the disconnecting device 104. In one example, the AVTPS 112 is a 24 V DC power supply. The AVTPS 112 in one example is integrated into the load control assembly 102, for example, with a power input of the AVTPS 112 connected to one or more lines of the supply input 103 in order to provide continuous power to the AVT 110 even when the disconnecting device 104 disconnects the power input of the load controller 106 from the supply input 103. In another implementation, the AVTPS 112 is mounted outside the load control assembly 102, and power connections (e.g., wiring) are provided from a power output of the AVTPS 112 to a power input of the AVT 110.

The load control assembly 102 includes an absence of voltage indicator 114 (e.g., labeled AV INDICATOR in the drawings). The AV indicator 114 is operatively coupled to the AVT 110 and the AV indicator 114 is configured to indicate the absence of an operating voltage of the load control assembly 102 detected by the AVT 110.

The load control assembly 102 is operatively coupled to an industrial network 116. In one example, the AVT 110 is configured to communicate the presence or absence of the operating voltage of the load control assembly 102 to the industrial automation control network 116. In this or another example, the AVT 110 is configured to communicate with the industrial automation control network 116 via network communication or a hardwire interface by networked communications protocols, including without limitation one or more of IEC 61580 MMS, GOOSE, SV, DNP 3.0, IEC 60870-5, Modbus TCP, EtherNet/IP, and DeviceNet. In these or another example, the load controller 106 is configured to implement a control function using Class 1 and Class 3 message schemes. In these or another example, the load controller 106 is configured to interface the control function to a process controller via a user configurable add-on profile (AOP).

In the above or other examples, the AVT 110 is configured to detect an absence of the operating voltage of the load control assembly 102, for example, by detecting that the voltage at the power output of the disconnecting device 104 is less than a predetermined threshold (e.g., approximately 5 V in one implementation). In the above or other examples, the absence of voltage indicator 114 is configured to indicate the presence of the operating voltage of the load control assembly 102 detected by the AVT 110. In these or other examples, the absence of voltage indicator 114 is configured to indicate the detected absence or presence of an operating voltage of the load control assembly 102 in any suitable fashion, including without limitation visible indicia that can be observed by personnel on the outside of the enclosure of the load control assembly 102, such as by an indicated color (e.g., green for absence of voltage, red for voltage present, etc.), readable text, such as on a user interface display, graphical symbols, or combinations thereof, etc., based on the detection operation of the AVT 110. In these or other examples, the load controller 106 is configured to allow an operator to remotely verify the absence of the operating voltage of the load control assembly 102, for example, by data or messaging via the industrial automation control network 116.

In these or other implementations, the AVT 110 is configured to detect when the operating voltage of the load control assembly 102 has been removed, for example, by changing and indicated color from green to red, by changing displayed text, by changing displayed graphical symbols, or combinations thereof, etc., based on a detection by the AVT 110 that voltage (e.g., above a predetermined threshold) that was previously present has been removed or is otherwise no longer present, etc. In one example, the AVT is configured to record the history of voltage variations.

In these or other examples, the AVT 110 is configured to detect when a stored voltage of the load control assembly 102 has been removed, for example, where the load controller 106 includes an internal DC bus or DC link circuit (not shown), and a DC bus voltage or a DC link current may be present in the load control assembly 102 after the disconnecting device 104 has been opened, for example, where a voltage at the output of the disconnecting device 104 may fall below the predetermined threshold prior to sufficient discharge of DC bus capacitors in a DC bus circuit of the load controller 106, and the AVT 110 detects when the DC bus voltage (e.g., stored voltage) of the load control assembly 102 falls below another predetermined threshold, or similar operation with respect to a DC link current flowing in the load controller 106 after the disconnecting device 104 removes the voltage applied to the load controller 106.

In the above or other examples, the AVT 110 is configured to detect the absence of the operating voltage of the load control assembly 102 using redundancy. For example, as discussed further below in connection with the example of FIG. 10) the AVT 110 is configured to take multiple readings of one or more voltages of the load control assembly 102.

In the above or other examples, the AVT 110 is configured to implement self-diagnostics for proper operation. In these or another example, the AVT indicator 114 is configured to selectively indicate proper operation of the AVT 110 or improper operation of the AVT 110, for example, by suitable color indication, textual indication, graphical symbol indication, or combinations thereof, etc.

Figure 2:
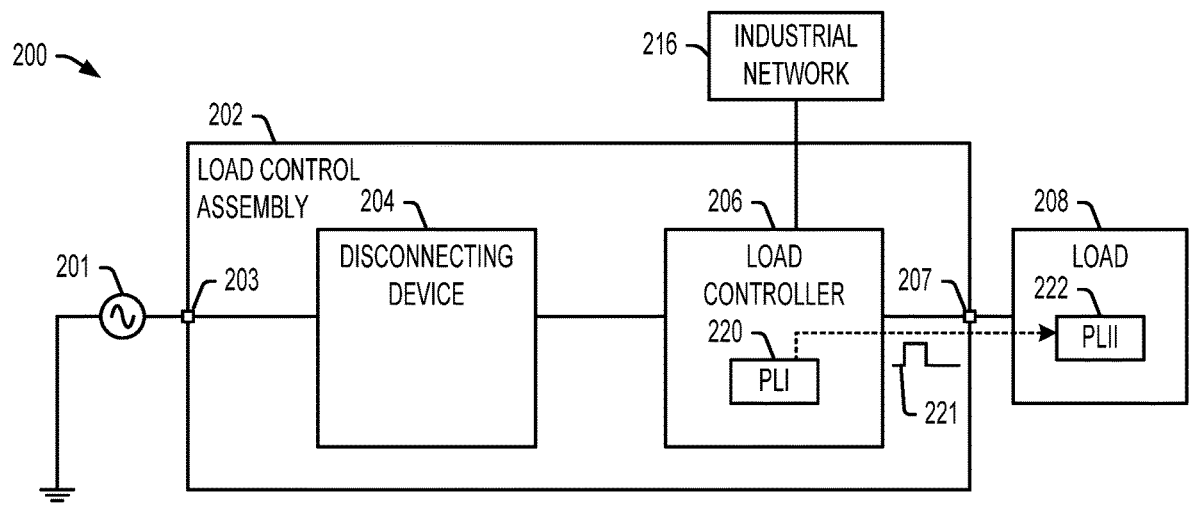
FIG. 2 is a system diagram of another industrial system having a positive load identification (PLI) component integrated into a load controller and a PLII indicator integrated into a load to indicate connection of the load in response to a load indication signal from the PLI component.

FIG. 2 shows another industrial system 200 having a positive load identification (PLI) component 220 integrated into a load controller 206 and a PLII indicator 222 integrated into a load 208 to indicate connection of the load in response to a load indication signal 221 from the PLI component 220. The industrial system 200 has a main power source 201 and a load control assembly 202 with a supply input 203 configured to be connected to the power source 201 in order to receive input power. In one implementation, the input power is a single or multiphase AC signal provided by a single or multiphase AC power source 201. In another example, the input power is a DC signal provided by a DC power source 201. The load control assembly 202 has a disconnecting device 204 coupled between the supply input 203 and a load controller 206. The connection of the disconnecting device 204 provides an interruptible power path between the supply input 203 and a power input of the load controller 206. The power path in one example is a single or multiphase AC power path with two or more power lines. In another example, the power path is a DC power path with one or two power lines. The load control assembly 202 also includes a load output 207 coupled to a power output of the load controller 206. The load output 207 is configured to be connected to an output load 208.

The load controller 206 in one example includes power conversion circuitry (not shown), for example, to convert input AC power to provide DC power to an intermediate DC bus or DC link circuit (not shown), as well as an output inverter (not shown), for example, to convert DC power from the DC bus to provide single or multiphase output AC power to drive an AC load 208. The load 208 in this example can be any type or form of single or multiphase AC load, such as a single or multiphase motor, a heating system, a lighting system, etc. In another example, the load controller 206 includes a DC to DC converter (not shown), for example, to convert DC input power to drive a DC load 208. In another example, the load controller includes an output inverter (not shown), for example, to convert DC input power from the disconnecting device 204 to drive an AC load 208, such as, a single or multiphase motor, lighting system, heating system, etc. The load control assembly 202 is operatively coupled to an industrial network 216 and is configured to communicate with the industrial automation control network 216 via network communication or a hard-wire interface by networked communications protocols, including without limitation one or more of IEC 61580 MMS, GOOSE, SV, DNP 3.0, IEC 60870-5, Modbus TCP, EtherNet/IP, and DeviceNet. In these or another example, the load controller 206 is configured to implement a control function using Class 1 and Class 3 message schemes. In these or another example, the load controller 206 is configured to interface the control function to a process controller via a user configurable add-on profile (AOP).

The industrial system 200 also includes the positive load identification PLI component 220 integrated into the load controller 206. The PLI component 220 is configured send a load indication signal 221 to the load output 207. The PLI indicator 222 is integrated into the load 208 and the PLII indicator 222 is coupled to the load output 207 to receive the load indication signal 221 from the PLI component 220. The PLII indicator 222 is configured to indicate connection of the load 208 in response to the load indication signal 221. This feature advantageously allows easy identification of a motor or other load 208 to which a given load controller 206 is connected, for example where it is important to ensure that a load 208 is unpowered before performing maintenance.

In one example, the load indication signal 221 is a power line communication (PLC) pulse signal transmitted to the load output 207 on one or more of the phase lines of an AC or DC output signal, and the PLII indicator 222 includes pulse sensing circuitry (not shown) to reliably detect the presence and/or other attributes of the load indication signal 221, such as pulse width, pulse spacing, pulse amplitude, etc. The PLII indicator 222 receives the load indication signal 221 and provides a visible and/or audible indication that the load indication signal 221 has been received, thus indicating that the associated load 208 is operatively connected to the load controller 206. In one example, a user interface associated with the load controller 206 (e.g., at the load control assembly 202 or via the network 216) allows a user to initiate generation of the load indication signal 221 by the PLI component 220. In this or another implementation, the PLI component 220 continuously or regularly provides the load indication signal 221 to the load output 207, and the PLII indicator 222 provides a continuing indication that the load 208 is operatively coupled to a powered load controller 206. In these or other examples, the PLII indicator 222 provides any suitable indication of the receipt of the load indication signal 221 from the PLI component 220, including without limitation visible indications (e.g., color based, text-based, graphical character-based, or combinations thereof, etc.) and/or audible indications.

Figure 3:
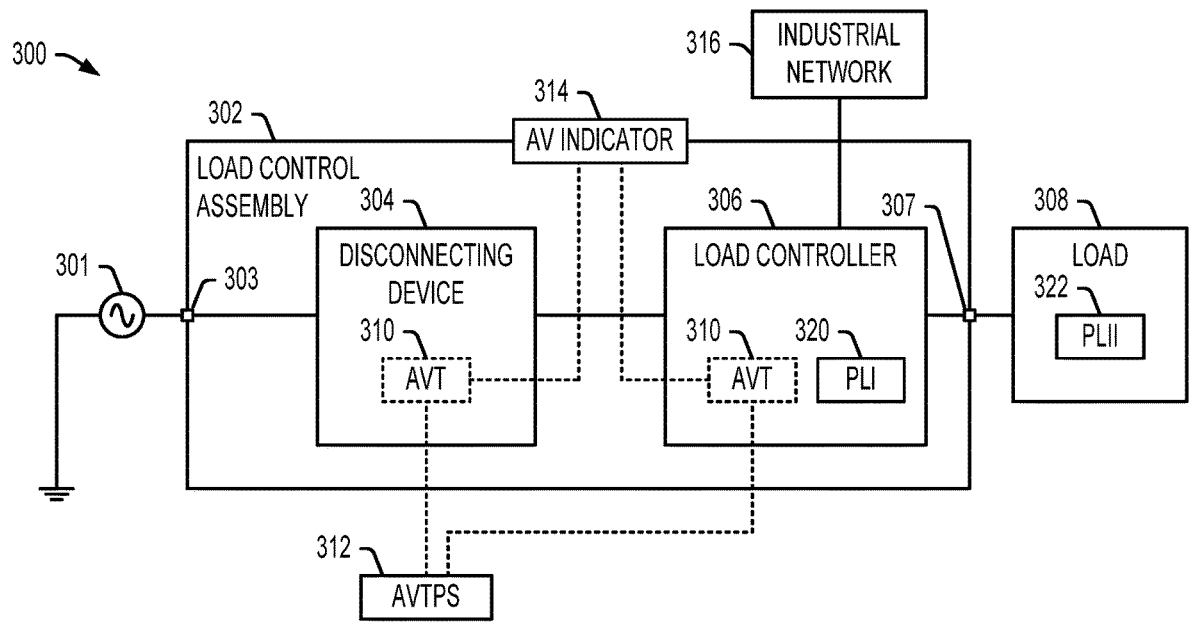
FIG. 3 is a system diagram of another industrial system having an integrated absence of voltage tester, a positive load identification (PLI) component integrated into a load controller, and a PLII indicator integrated into a load to indicate connection of the load in response to a load indication signal from the PLI component.

FIG. 3 shows another industrial system 300 having an integrated absence of voltage tester 310, a PLI component 320 integrated into a load controller 306, and a PLII indicator 322 integrated into a load 308 to indicate connection of the load 308 in response to a load indication signal 321 from the PLI component 320. The industrial system 300 has a main power source 301 and a load control assembly 302 with an integrated absence of voltage tester. The load control assembly 302 has a supply input 303 configured to be connected to the power source 301 in order to receive input power. In one implementation, the input power is a single or multiphase AC signal provided by a single or multiphase AC power source 301. In another example, the input power is a DC signal provided by a DC power source 301. The load control assembly 302 as a disconnecting device 304 coupled between the supply input 303 and a load controller 306. The connection of the disconnecting device 304 provides an interruptible power path between the supply input 303 and a power input of the load controller 306. The power path in one example is a single or multiphase AC power path with two or more power lines. In another example, the power path is a DC power path with one or two power lines. The load control assembly 302 also includes a load output 307 coupled to a power output of the load controller 306. The load output 307 is configured to be connected to an output load 308.

The load controller 306 in one example includes power conversion circuitry (not shown), for example, to convert input AC power to provide DC power to an intermediate DC bus or DC link circuit (not shown), as well as an output inverter (not shown), for example, to convert DC power from the DC bus to provide single or multiphase output AC power to drive an AC load 308. The load 308 in this example can be any type or form of single or multiphase AC load, such as a single or multiphase motor, a heating system, a lighting system, etc. In another example, the load controller 306 includes a DC to DC converter (not shown), for example, to convert DC input power to drive a DC load 308. In another example, the load controller includes an output inverter (not shown), for example, to convert DC input power from the disconnecting device 304 to drive an AC load 308, such as, a single or multiphase motor, lighting system, heating system, etc.

The load control assembly 302 also includes an absence of voltage tester (e.g., labeled AVT in the drawings) 310 that is integrated into one or both of the disconnecting device 304 and/or the load controller 306. The AVT 310 is described hereinafter in singular form, and the following description applies to both AVTs 310 if multiple AVTs 310 are provided in the load control assembly 302. The AVT 310 is configured to detect an absence of an operating voltage of the load control assembly 302.

The industrial system 300 also includes an absence of voltage power source 312 (e.g., labeled AVTPS in the drawings). The AVTPS 312 is coupled to the AVT 310. The AVTPS 312 supplies power to the AVT 310 independent of the powered or unpowered status of the power path and the operational state of the disconnecting device 304. In one example, the AVTPS 312 is a 24 V DC power supply. The AVTPS 312 in one example is integrated into the load control assembly 302, for example, with a power input of the AVTPS 312 connected to one or more lines of the supply input 303 in order to provide continuous power to the AVT 310 even when the disconnecting device 304 disconnects the power input of the load controller 306 from the supply input 303. In another implementation, the AVTPS 312 is mounted outside the load control assembly 302, and power connections (e.g., wiring) are provided from a power output of the AVTPS 312 to a power input of the AVT 310.

The load control assembly 302 includes an absence of voltage indicator 314 (e.g., labeled AV INDICATOR in the drawings). The AV indicator 314 is operatively coupled to the AVT 310 and the AV indicator 314 is configured to indicate the absence of an operating voltage of the load control assembly 302 detected by the AVT 310.

The load control assembly 302 is operatively coupled to an industrial network 316. In one example, the AVT 310 is configured to communicate the presence or absence of the operating voltage of the load control assembly 302 to the industrial automation control network 316. In this or another example, the AVT 310 is configured to communicate with the industrial automation control network 316 via network communication or a hardwire interface by networked communications protocols, including without limitation one or more of IEC 61580 MMS, GOOSE, SV, DNP 3.0, IEC 60870-5, Modbus TCP, EtherNet/IP, and DeviceNet. In these or another example, the load controller 306 is configured to implement a control function using Class 1 and Class 3 message schemes. In these or another example, the load controller 306 is configured to interface the control function to a process controller via a user configurable add-on profile (AOP).

In the above or other examples, the AVT 310 is configured to detect an absence of the operating voltage of the load control assembly 302, for example, by detecting that the voltage at the power output of the disconnecting device 304 is less than a predetermined threshold (e.g., approximately 5 V in one implementation). In the above or other examples, the absence of voltage indicator 314 is configured to indicate the presence of the operating voltage of the load control assembly 302 detected by the AVT 310. In these or other examples, the absence of voltage indicator 314 is configured to indicate the detected absence or presence of an operating voltage of the load control assembly 302 in any suitable fashion, including without limitation visible indicia that can be observed by personnel on the outside of the enclosure of the load control assembly 302, such as by an indicated color (e.g., green for absence of voltage, red for voltage present, etc.), readable text, such as on a user interface display, graphical symbols, or combinations thereof, etc., based on the detection operation of the AVT 310. In these or other examples, the load controller 306 is configured to allow an operator to remotely verify the absence of the operating voltage of the load control assembly 302, for example, by data or messaging via the industrial automation control network 316.

In these or other implementations, the AVT 310 is configured to detect when the operating voltage of the load control assembly 302 has been removed, for example, by changing and indicated color from green to red, by changing displayed text, by changing displayed graphical symbols, or combinations thereof, etc., based on a detection by the AVT 310 that voltage (e.g., above a predetermined threshold) that was previously present has been removed or is otherwise no longer present, etc.

In these or other examples, the AVT 310 is configured to detect when a stored voltage of the load control assembly 302 has been removed, for example, where the load controller 306 includes an internal DC bus or DC link circuit (not shown), and a DC bus voltage or a DC link current may be present in the load control assembly 302 after the disconnecting device 304 has been opened, for example, where a voltage at the output of the disconnecting device 304 may fall below the predetermined threshold prior to sufficient discharge of DC bus capacitors in a DC bus circuit of the load controller 306, and the AVT 310 detects when the DC bus voltage (e.g., stored voltage) of the load control assembly 302 falls below another predetermined threshold, or similar operation with respect to a DC link current flowing in the load controller 306 after the disconnecting device 304 removes the voltage applied to the load controller 306.

In the above or other examples, the AVT 310 is configured to detect the absence of the operating voltage of the load control assembly 302 using redundancy. For example, as discussed further below in connection with the example of FIG. 10) the AVT 310 is configured to take multiple readings of one or more voltages of the load control assembly 302. In one example, the AVT 310 is configured to take voltage reading in separate physical locations to help ensure the measurements are not subject to the same potential point of failures. In these or other examples, the test circuits can be redundant such that the AVT 310 includes two separates test circuits to assure two separates redundant channels.

In the above or other examples, the AVT 310 is configured to implement self-diagnostics for proper operation. In these or another example, the AVT indicator 314 is configured to selectively indicate proper operation of the AVT 310 or improper operation of the AVT 310, for example, by suitable color indication, textual indication, graphical symbol indication, or combinations thereof, etc.

The industrial system 300 also includes the positive load identification PLI component 320 integrated into the load controller 306. The PLI component 320 is configured send a load indication signal 321 to the load output 307. The PLII indicator 322 is integrated into the load 308 and the PLII indicator 322 is coupled to the load output 307 to receive the load indication signal 321 from the PLI component 320. The PLII indicator 322 is configured to indicate connection of the load 308 in response to the load indication signal 321. This feature advantageously allows easy identification of a motor or other load 308 to which a given load controller 306 is connected, for example where it is important to ensure that a load 308 is unpowered before performing maintenance.

In one example, the load indication signal 321 is a power line communication (PLC) pulse signal transmitted to the load output 307 on one or more of the phase lines of an AC or DC output signal, and the PLII indicator 322 includes pulse sensing circuitry (not shown) to reliably detect the presence and/or other attributes of the load indication signal 321, such as pulse width, pulse spacing, pulse amplitude, etc. The PLII indicator 322 receives the load indication signal 321 and provides a visible and/or audible indication that the load indication signal 321 has been received, thus indicating that the associated load 308 is operatively connected to the load controller 306. In one example, a user interface associated with the load controller 306 (e.g., at the load control assembly 302 or via the network 316) allows a user to initiate generation of the load indication signal 321 by the PLI component 320. In this or another implementation, the PLI component 320 continuously or regularly provides the load indication signal 321 to the load output 307, and the PLII indicator 322 provides a continuing indication that the load 308 is operatively coupled to a powered load controller 306. In these or other examples, the PLII indicator 322 provides any suitable indication of the receipt of the load indication signal 321 from the PLI component 320, including without limitation visible indications (e.g., color based, text-based, graphical character-based, or combinations thereof, etc.) and/or audible indications.

Figure 4:
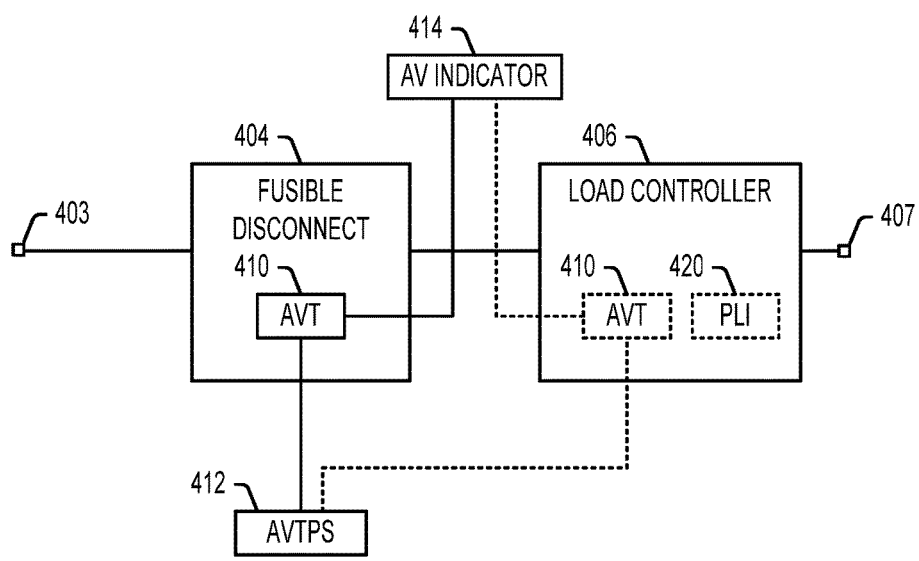
FIG. 4 is a partial system diagram of another industrial system having a load control assembly with an absence of voltage tester integrated in a fusible disconnect device.
Figure 5:
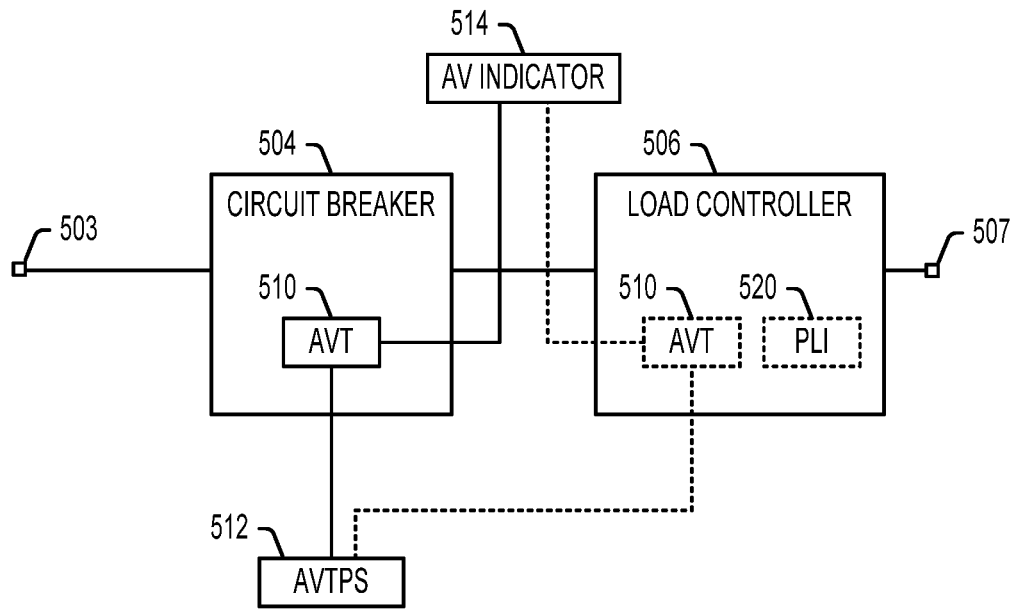
FIG. 5 is a partial system diagram of another industrial system having a load control assembly with an absence of voltage tester integrated in a circuit breaker.

Referring also to FIGS. 4 and 5, an AVT can be integrated into any type or form of disconnecting device, along or in combination with another AVT integrated into the load controller and/or with a PLI component integrated into the load controller.

FIG. 4 shows another industrial system 400 having a load control assembly with an absence of voltage tester 410 integrated in a fusible disconnect device 404. The industrial system 400 may have a PLI component 420 integrated into a load controller 406, and a PLI indicator integrated into a load (not shown) to indicate connection of the load in response to a load indication signal from the PLI component 420. The industrial system 400 has a main power source and a load control assembly (not shown) with the integrated absence of voltage tester 410. The load control assembly has a supply input 403 configured to be connected to the power source to receive input power and a disconnecting device 404 coupled between the supply input 403 and a load controller 406. The connection of the fusible disconnect device 404 provides an interruptible power path between the supply input 403 and a power input of the load controller 406. The power path in one example is a single or multiphase AC power path with two or more power lines. In another example, the power path is a DC power path with one or two power lines. The load control assembly also includes a load output 407 coupled to a power output of the load controller 406. The load output 407 is configured to be connected to an output load (not shown).

The load controller 406 in one example includes power conversion circuitry (not shown), for example, to convert input AC power to provide DC power to an intermediate DC bus or DC link circuit (not shown), as well as an output inverter (not shown), for example, to convert DC power from the DC bus to provide single or multiphase output AC power to drive an AC load. The load in this example can be any type or form of single or multiphase AC load, such as a single or multiphase motor, a heating system, a lighting system, etc. In another example, the load controller 406 includes a DC to DC converter (not shown), for example, to convert DC input power to drive a DC load. In another example, the load controller includes an output inverter (not shown), for example, to convert DC input power from the fusible disconnect device 404 to drive an AC load, such as, a single or multiphase motor, lighting system, heating system, etc. (not shown).

The load control assembly includes the AVT 410 that is integrated into the fusible disconnect device 404 and another AVT can be integrated into the load controller 406. The AVT 410 of the fusible disconnect device 404 is configured to detect an absence of an operating voltage of the load control assembly. The industrial system 400 also includes an absence of voltage power source 412 (e.g., labeled AVTPS in the drawings). The AVTPS 412 is coupled to the AVT 410. The AVTPS 412 supplies power to the AVT 410 independent of the powered or unpowered status of the power path and the operational state of the fusible disconnect device 404. In one example, the AVTPS 412 is a 24 V DC power supply. The AVTPS 412 can be integrated into the load control assembly or can be externally mounted and operates to provide continuous power to the AVT 410 even when the fusible disconnect device 404 disconnects the power input of the load controller 406 from the supply input 403.

The load control assembly includes an absence of voltage indicator 414 (e.g., labeled AV INDICATOR in the drawings). The AV indicator 414 is operatively coupled to the AVT 410 and the AV indicator 414 is configured to indicate the absence of an operating voltage of the load control assembly detected by the AVT 410. The load control assembly can be operatively coupled to an industrial network (not shown) as described above. In one example, the AVT 410 is configured to communicate the presence or absence of the operating voltage of the load control assembly to the industrial automation control network. In this or another example, the AVT 410 is configured to communicate with the industrial automation control network via network communication or a hardwire interface by networked communications protocols, including without limitation one or more of IEC 61580 MMS, GOOSE, SV, DNP 3.0, IEC 60870-5, Modbus TCP, EtherNet/IP, and DeviceNet. In these or another example, the load controller 406 is configured to implement a control function using Class 1 and Class 3 message schemes. In these or another example, the load controller 406 is configured to interface the control function to a process controller via a user configurable add-on profile (AOP).

In the above or other examples, the AVT 410 is configured to detect an absence of the operating voltage of the load control assembly, for example, by detecting that the voltage at the power output of the fusible disconnect device 404 is less than a predetermined threshold (e.g., approximately 5 V in one implementation). In the above or other examples, the absence of voltage indicator 414 is configured to indicate the presence of the operating voltage of the load control assembly detected by the AVT 410. In these or other examples, the absence of voltage indicator 414 is configured to indicate the detected absence or presence of an operating voltage of the load control assembly in any suitable fashion, including without limitation visible indicia that can be observed by personnel on the outside of the enclosure of the load control assembly, such as by an indicated color (e.g., green for absence of voltage, red for voltage present, etc.), readable text, such as on a user interface display, graphical symbols, or combinations thereof, etc., based on the detection operation of the AVT 410. In these or other examples, the load controller 406 is configured to allow an operator to remotely verify the absence of the operating voltage of the load control assembly, for example, by data or messaging via the industrial automation control network 416.

In these or other implementations, the AVT 410 is configured to detect when the operating voltage of the load control assembly has been removed, for example, by changing and indicated color from green to red, by changing displayed text, by changing displayed graphical symbols, or combinations thereof, etc., based on a detection by the AVT 410 that voltage (e.g., above a predetermined threshold) that was previously present has been removed or is otherwise no longer present, etc.

In these or other examples, the AVT 410 is configured to detect when a stored voltage of the load control assembly has been removed, for example, where the load controller 406 includes an internal DC bus or DC link circuit (not shown), and a DC bus voltage or a DC link current may be present in the load control assembly after the fusible disconnect device 404 has been opened, for example, where a voltage at the output of the fusible disconnect device 404 may fall below the predetermined threshold prior to sufficient discharge of DC bus capacitors in a DC bus circuit of the load controller 406, and the AVT 410 detects when the DC bus voltage (e.g., stored voltage) of the load control assembly falls below another predetermined threshold, or similar operation with respect to a DC link current flowing in the load controller 406 after the fusible disconnect device 404 removes the voltage applied to the load controller 406.

In the above or other examples, the AVT 410 is configured to detect the absence of the operating voltage of the load control assembly using redundancy. For example, as discussed further below in connection with the example of FIG. 10) the AVT 410 is configured to take multiple readings of one or more voltages of the load control assembly.

In the above or other examples, the AVT 410 is configured to implement self-diagnostics for proper operation. In these or another example, the AVT indicator 414 is configured to selectively indicate proper operation of the AVT 410 or improper operation of the AVT 410, for example, by suitable color indication, textual indication, graphical symbol indication, or combinations thereof, etc.

The industrial system 400 also includes the positive load identification PLI component 420 integrated into the load controller 406. The PLI component 420 is configured send a load indication signal (not shown) to the load output 407. A PLI indicator (not shown) is integrated into the load (not shown) and is coupled to the load output 407 to receive the load indication signal from the PLI component 420. The PLI indicator is configured to indicate connection of the load in response to the load indication signal. This feature advantageously allows easy identification of a motor or other load to which a given load controller 406 is connected, for example where it is important to ensure that a load is unpowered before performing maintenance.

In one example, the load indication signal is a power line communication (PLC) pulse signal transmitted to the load output 407 on one or more of the phase lines of an AC or DC output signal, and the PLI indicator includes pulse sensing circuitry (not shown) to reliably detect the presence and/or other attributes of the load indication signal, such as pulse width, pulse spacing, pulse amplitude, etc. The PLI indicator receives the load indication signal and provides a visible and/or audible indication that the load indication signal has been received, thus indicating that the associated load is operatively connected to the load controller 406. In one example, a user interface associated with the load controller 406 (e.g., at the load control assembly or via the network) allows a user to initiate generation of the load indication signal by the PLI component 420. In this or another implementation, the PLI component 420 continuously or regularly provides the load indication signal to the load output 407, and the PLI indicator provides a continuing indication that the load is operatively coupled to a powered load controller 406. In these or other examples, the PLI indicator provides any suitable indication of the receipt of the load indication signal from the PLI component 420, including without limitation visible indications (e.g., color based, text-based, graphical character-based, or combinations thereof, etc.) and/or audible indications.

FIG. 5 shows another example industrial system 500 having a load control assembly with an AVT 510 integrated in a circuit breaker 504. The system 500 includes a main power source and a load control assembly (not shown) with a supply input 503 configured to be connected to the power source to receive input power, and the circuit breaker 504 is coupled between the supply input 503 and a load controller 506 with a power output coupled to a load output 507. The industrial system 500 also includes an absence of voltage power source 512 and an absence of voltage indicator 514 operatively coupled to the AVT 510. The industrial system 500 may have a PLI component 520 integrated into a load controller 506, and a PLI indicator (not shown) integrated into a load. In one example, the structures, components and features 503, 506, 507, 510, 512, and 514 correspond to the respective structures, components and features 103, 106, 107, 110, 112, and 114 described above in connection with FIG. 1 and the PLI component 520 corresponds to the PLI component 220 described above in connection with FIG. 2.

Figure 6:
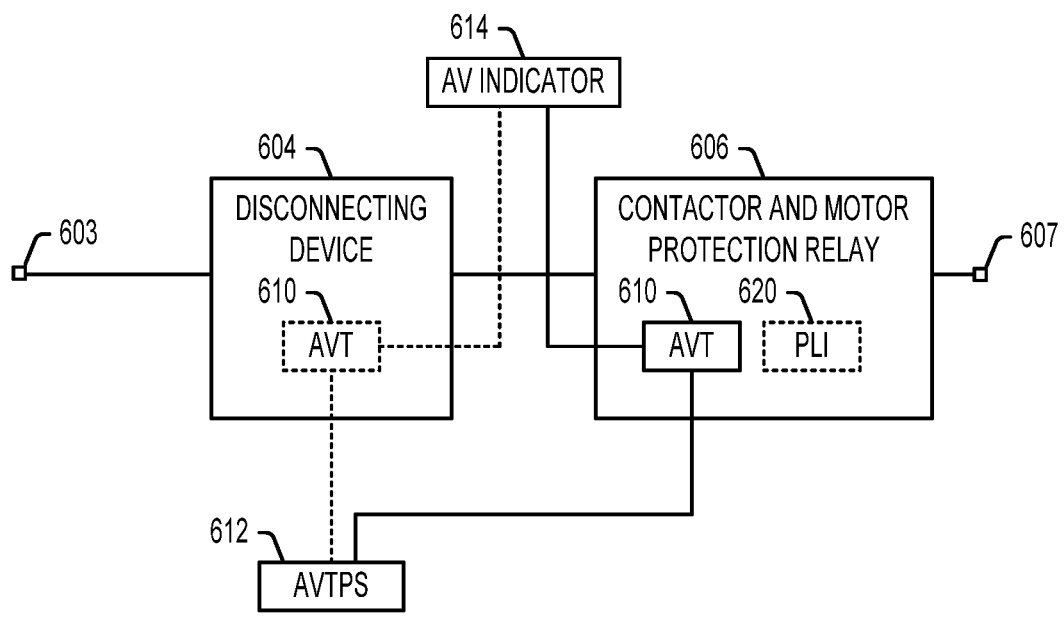
FIG. 6 is a partial system diagram of another industrial system having a load control assembly with an absence of voltage tester integrated in a contactor and motor protection relay.

FIGS. 6-9 show further examples in which an AVT is integrated into a load controller and the load controller is a contactor, a motor protection relay, a variable frequency drive VFD, a soft starter, and a solid state relay, respectively. FIG. 6 shows another example industrial system 600 having a load control assembly with an AVT 610 integrated in a contactor and motor protection relay 606. The system 600 includes a main power source and a load control assembly (not shown) with a supply input 603 configured to be connected to the power source to receive input power, and a disconnecting device 604 is coupled between the supply input 603 and a contactor and motor protection relay 606 with a power output coupled to a load output 607. The industrial system 600 also includes an absence of voltage power source 612 and an absence of voltage indicator 614 operatively coupled to the AVT 610. The industrial system 600 may have a PLI component 620 integrated into the contactor and motor protection relay 606, and a PLI indicator (not shown) integrated into a load. In one example, the structures, components and features 603, 604, 607, 610, 612, and 614 correspond to the respective structures, components and features 103, 104, 107, 110, 112, and 114 described above in connection with FIG. 1 and the PLI component 620 corresponds to the PLI component 220 described above in connection with FIG. 2.

Figure 7:
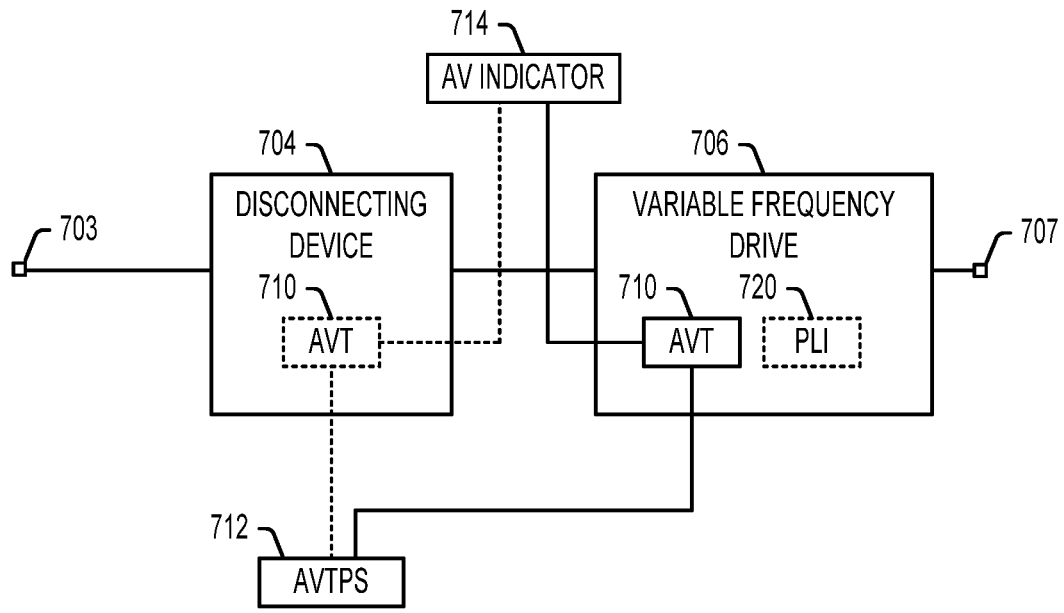
FIG. 7 is a partial system diagram of another industrial system having a load control assembly with an absence of voltage tester integrated in a variable frequency drive.

FIG. 7 shows another example industrial system 700 having a load control assembly with an AVT 710 integrated in a variable frequency drive 706. The system 700 includes a main power source and a load control assembly (not shown) with a supply input 703 configured to be connected to the power source to receive input power, and a disconnecting device 704 is coupled between the supply input 703 and the variable frequency drive 706 with a power output coupled to a load output 707. The industrial system 700 also includes an absence of voltage power source 712 and an absence of voltage indicator 714 operatively coupled to the AVT 710. The industrial system 700 may have a PLI component 720 integrated into the contactor and variable frequency drive 706, and a PLI indicator (not shown) integrated into a load. In one example, the structures, components and features 703, 704, 707, 710, 712, and 714 correspond to the respective structures, components and features 103, 104, 107, 110, 112, and 114 described above in connection with FIG. 1 and the PLI component 720 corresponds to the PLI component 220 described above in connection with FIG. 2.

Figure 8:
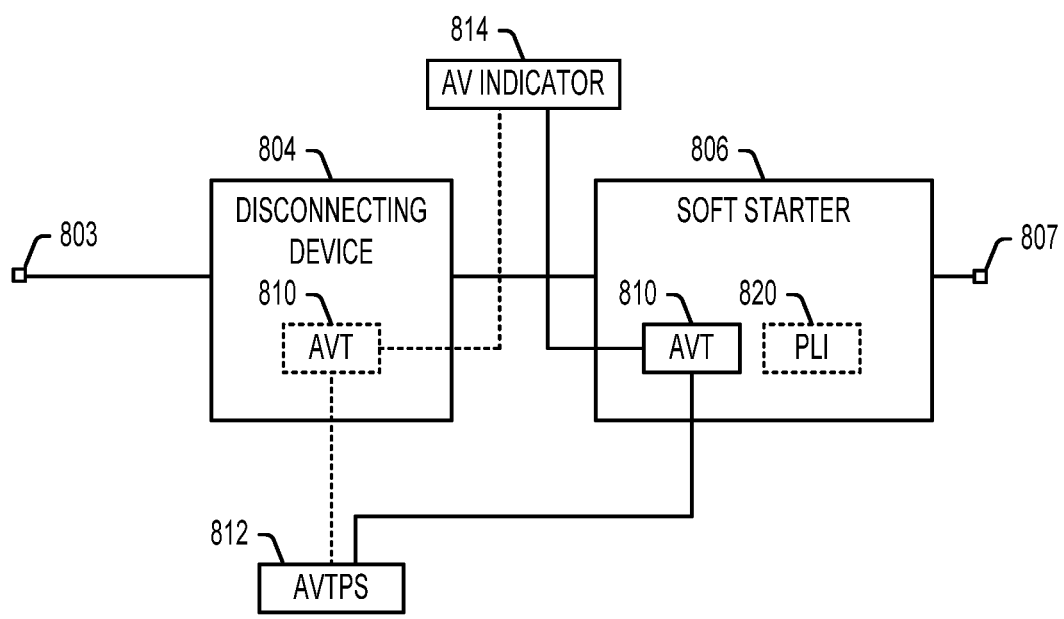
FIG. 8 is a partial system diagram of another industrial system having a load control assembly with an absence of voltage tester integrated in a soft starter.

FIG. 8 shows another example industrial system 800 having a load control assembly with an AVT 810 integrated in a soft starter 806. The system 800 includes a main power source and a load control assembly (not shown) with a supply input 803 configured to be connected to the power source to receive input power, and a disconnecting device 804 is coupled between the supply input 803 and a soft starter 806 with a power output coupled to a load output 807. The industrial system 800 also includes an absence of voltage power source 812 and an absence of voltage indicator 814 operatively coupled to the AVT 810. The industrial system 800 may have a PLI component 820 integrated into the soft starter 806, and a PLI indicator (not shown) integrated into a load. In one example, the structures, components and features 803, 804, 807, 810, 812, and 814 correspond to the respective structures, components and features 103, 104, 107, 110, 112, and 114 described above in connection with FIG. 1 and the PLI component 820 corresponds to the PLI component 220 described above in connection with FIG. 2.

Figure 9:
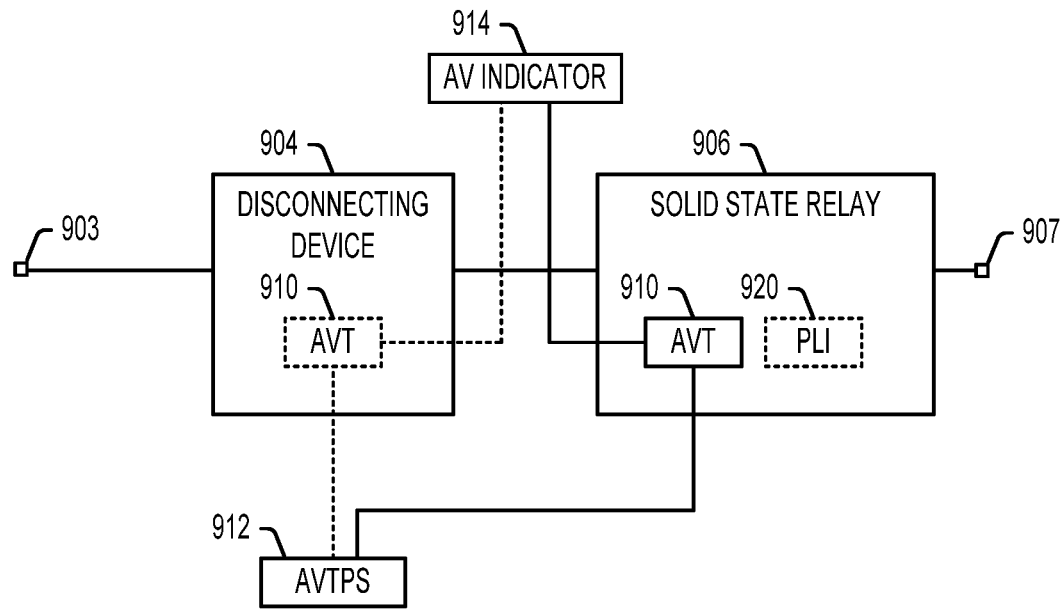
FIG. 9 is a partial system diagram of another industrial system having a load control assembly with an absence of voltage tester integrated in a solid-state relay.

FIG. 9 shows another example industrial system 900 having a load control assembly with an AVT 910 integrated in a solid-state relay 906. The system 900 includes a main power source and a load control assembly (not shown) with a supply input 903 configured to be connected to the power source to receive input power, and a disconnecting device 904 is coupled between the supply input 903 and the solid-state relay 906 with a power output coupled to a load output 907. The industrial system 900 also includes an absence of voltage power source 912 and an absence of voltage indicator 914 operatively coupled to the AVT 910. The industrial system 900 may have a PLI component 920 integrated into the solid-state relay 906, and a PLI indicator (not shown) integrated into a load. In one example, the structures, components and features 903, 904, 907, 910, 912, and 914 correspond to the respective structures, components and features 103, 104, 107, 110, 112, and 114 described above in connection with FIG. 1 and the PLI component 920 corresponds to the PLI component 220 described above in connection with FIG. 2.

Figure 10:
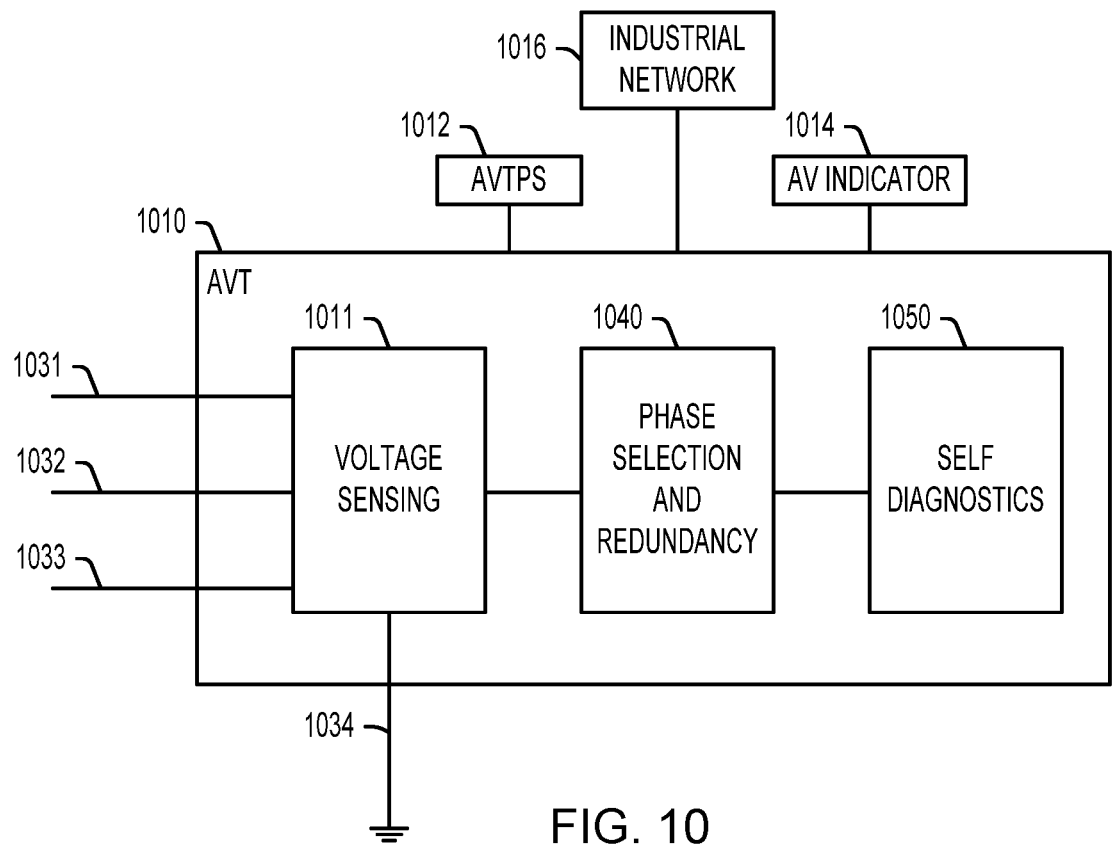
FIG. 10 is a partial schematic diagram of an integrated AVT connected to an AVT power source, and AV indicator and an industrial network.

FIG. 10 shows an example integrated AVT 1010 connected to an AVT power source 1012, an AV indicator 1014 and an industrial network 1016. In one implementation, the AVT 1010, the AVT power source 1012, the AV indicator 1014, and the industrial network 1016 generally correspond to the respective structures, components and features 110, 112, 114, and 116 described above in connection with FIG. 1. The AVT 1010 is illustrated with connections to a three phase power path including a first phase or line 1031, a second phase or line 1032, and a third phase or line 1033. Whether the AVT 1010 is integrated into a disconnecting device (e.g., 104 above) or a load controller (e.g., 106 above) of a given industrial system (e.g., 100 above), the AVT 1010 includes voltage sensing components or circuits 1011 that are operatively connected to sense or otherwise measure voltages of the lines 1031-1033 relative to one another (e.g., phase-phase voltages) and/or relative to a ground or neutral connection 1034 (e.g., phase to ground or phase to neutral voltages). In one example, the lines 1031-1033 correspond to the voltage path between the output of the disconnecting device 104 and the load controller 106, whether the AVT 1010 is integrated into the disconnecting device 104 or into the load controller 106. The ground or neutral connection 1034 in one example is a ground reference connection or neutral of the power source (e.g., 101 above) of the industrial system. In one or more implementations, the AVT 1010 is configured to measure multiple line to line and/or line to ground voltages to detect the absence of the operating voltage of the load control assembly, for example, indicating an absence of voltage condition of the lines 1031-1033 of the associated load control assembly when all of the measured voltages are less than a corresponding predetermined threshold. In these or other examples, the AVT 1010 is configured to make multiple measurements of each respective line to line and/or line to ground voltages to detect the absence of the operating voltage of the load control assembly 102, for example, indicating an absence of voltage condition when all of the measurements of all of the voltages are less than a corresponding predetermined threshold, and otherwise indicating the presence of voltage in the associated load control assembly. In these or other examples, moreover, the voltage sensing circuitry 1011 can be coupled to measure a stored voltage of the load control assembly, for example, a DC bus voltage of the load controller 106 (not shown) in detecting and determining the presence or absence of voltage in the associated load control assembly.

Described examples provide integration solutions to integrate AVT functionality in a power control device, such as a disconnecting device and/or a load controller of a load control assembly. The described solutions provide cost and space savings in motor drives, heating system power converters, lighting system power converters, and other applications. The integration of the AVT and AVT indicator functionality facilitates maintenance operations and lock-out/tag out procedures that help maintenance personnel service industrial equipment while minimizing risk of injury and/or equipment damage in an industrial system. In further aspects or in combination with the integrated AVT functionality, described examples further facilitate safety in industrial systems by providing positive load identification, for example, to facilitate lock-out/tag-out procedures by incorporating a feature into the power control device that would help a user to confirm which motor is wired to a particular motor controller, or other load/load control assembly interconnections within an industrial system for motor drives, heating systems, lighting systems or other applications. The described PLI components and PLI indicators in certain examples provide a signal over the motor cable, a heater power cable, a lighting power cable, etc. to indicate at the load side that this is the load being controlled by the load controller, for example using a pulse modulation communication between the load and the load controller.

In certain examples where the AVT functionality is integrated into a disconnecting means (e.g., disconnecting device 104), the AVT (e.g., AVT 110) could also be configured to verify the absence of voltage on the line side of the controller, for example, to provide useful information if isolating the main/source, either remotely or using a withdraw with door closed feature (e.g., sometimes referred to as SecureConnect), and/or the AVT could enable a user to diagnose a blown fuse condition (e.g., absence verified on the load side but not the line side, with a handle in an "on" state). In various implementations, there could be a difference in functionality of the AVT feature if it is positioned on the line side, load side, or both sides of the disconnecting means. Unless the context clearly requires otherwise, throughout the description and the claims, the words "comprise," "comprising," and the like are to be construed in an inclusive sense, as opposed to an exclusive or exhaustive sense; that is to say, in the sense of "including, but not limited to." As used herein, the terms "connected,"

"coupled," or any variant thereof means any connection or coupling, either direct or indirect, between two or more elements; the coupling or connection between the elements can be physical, logical, or a combination thereof. Additionally, the words "herein," "above," "below," and words of similar import, when used in this application, refer to this application as a whole and not to any particular portions of this application. Where the context permits, words in the above description using the singular or plural number may also include the plural or singular number respectively. The word "or" in reference to a list of two or more items, covers all of the following interpretations of the word: any of the items in the list, all of the items in the list, and any combination of the items in the list.

The following is claimed:

1. An industrial system, comprising:
a load control assembly having a supply input, a load output, a disconnecting device, and a load controller coupled to the load output, the disconnecting device coupled between the supply input and the load controller;
an absence of voltage tester (AVT) integrated into one of the disconnecting device and the load controller, the AVT configured to detect an absence of an operating voltage of the load control assembly;
an absence of voltage indicator coupled to the AVT and configured to indicate the absence of the operating voltage of the load control assembly detected by the AVT;
a positive load identification (PLI) component integrated into the load controller and configured to send a load indication signal to the load output; and
a PLI indicator integrated into a load and coupled to the load output to receive the load indication signal, the PLI indicator configured to indicate connection of the load in response to the load indication signal.

2. The industrial system of claim 1, wherein:
the AVT is integrated into the disconnecting device; and
the disconnecting device is one of a fusible disconnect and a circuit breaker.

3. The industrial system of claim 1, wherein:
the AVT is integrated into the load controller; and
the load controller is one of a contactor, a motor protection relay, a variable frequency drive (VFD), a soft starter, and a solid state relay.

4. The industrial system of claim 1, comprising an absence of voltage power source coupled to the AVT.

5. The industrial system of claim 1, wherein the AVT is configured to detect when the operating voltage of the load control assembly has been removed.

6. The industrial system of claim 1, wherein the AVT is configured to detect when a stored voltage of the load control assembly has been removed.

7. The industrial system of claim 1, wherein the AVT is configured to implement self-diagnostics for proper operation.

8. The industrial system of claim 7, wherein the absence of voltage indicator is configured to indicate proper operation of the AVT.

9. The industrial system of claim 1, wherein the absence of voltage indicator is configured to indicate the presence of the operating voltage of the load control assembly detected by the AVT.

10. The industrial system of claim 1, wherein the AVT is configured to communicate the presence or absence of the operating voltage of the load control assembly to an industrial automation control network.

11. The industrial system of claim 10, wherein the AVT is configured to communicate with the industrial automation control network via network communication or a hardwire interface by networked communications protocols comprising one or more of IEC 61580 MMS, GOOSE, SV, DNP 3.0, IEC 60870-5, Modbus TCP, EtherNet/IP, and DeviceNet.

12. The industrial system of claim 1, wherein the load controller is configured to implement a control function.

13. The industrial system of claim 12, wherein the load controller is configured to interface the control function to a process controller via a user configurable add-on profile.

14. The industrial system of claim 1, wherein the load controller is configured to allow an operator to remotely verify the absence of the operating voltage of the load control assembly.

15. The industrial system of claim 1, wherein the AVT is configured to measure multiple line to line or line to ground voltages to detect the absence of the operating voltage of the load control assembly.

16. The industrial system of claim 15, wherein the AVT is configured to make multiple measurements of each respective line to line or line to ground voltages to detect the absence of the operating voltage of the load control assembly.

17. An industrial system, comprising:
a load control assembly having a supply input, a load output, a disconnecting device, and a load controller coupled to the load output, the disconnecting device coupled between the supply input and the load controller;
a positive load identification (PLI) component integrated into the load controller and configured to send a load indication signal to the load output; and
a PLI indicator integrated into a load and coupled to the load output to receive the load indication signal, the PLI indicator configured to indicate connection of the load in response to the load indication signal.

18. An industrial system, comprising:
a load control assembly having a supply input, a load output, a disconnecting device, and a load controller coupled to the load output, the disconnecting device coupled between the supply input and the load controller;
an absence of voltage tester (AVT) integrated into one of the disconnecting device and the load controller, the AVT configured to detect an absence of an operating voltage of the load control assembly; and
an absence of voltage indicator coupled to the AVT and configured to indicate the absence of the operating voltage of the load control assembly detected by the AVT, wherein the AVT is configured to detect the absence of the operating voltage of the load control assembly using redundancy.

19. The industrial system of claim 18, wherein:
the AVT is integrated into the disconnecting device; and
the disconnecting device is one of a fusible disconnect and a circuit breaker.

20. The industrial system of claim 18, wherein:
the AVT is integrated into the load controller; and
the load controller is one of a contactor, a motor protection relay, a variable frequency drive (VFD), a soft starter, and a solid state relay.

* * * * *